US012279533B2

United States Patent
Collins et al.

(10) Patent No.: US 12,279,533 B2
(45) Date of Patent: Apr. 15, 2025

(54) THERMOELECTRIC MATERIALS (71) Applicant: UNIVERSITY OF LIMERICK, Limerick (IE)

(72) Inventors: Maurice Collins, Limerick (IE); Mario Culebras Rubio, Limerick (IE); Juan Jose Vilatela, Madrid (ES)

(73) Assignees: UNIVERSITY OF LIMERICK, Limerick (IE); FUNDACION IMDEA MATERIALES, Madrid (ES)

( * ) Notice: Subject to any disclaimer, the term of this patent is extended or adjusted under 35 U.S.C. 154(b) by 0 days.

(21) Appl. No.: 17/414,608

(22) PCT Filed: Dec. 13, 2019

(86) PCT No.: PCT/EP2019/085102
§ 371 (c)(1),
(2) Date: Jun. 16, 2021

(87) PCT Pub. No.: WO2020/126912
PCT Pub. Date: Jun. 25, 2020

(65) Prior Publication Data
US 2022/0052246 A1 Feb. 17, 2022

(30) Foreign Application Priority Data
Dec. 18, 2018 (GB) .................................... 1820651

(51) Int. Cl.
*H10N 10/856* (2023.01)
*C08L 97/00* (2006.01)
(Continued)

(52) U.S. Cl.
CPC .......... *H10N 10/857* (2023.02); *C08L 97/005* (2013.01); *H10N 10/01* (2023.02); *H10N 10/856* (2023.02)

(58) Field of Classification Search
None
See application file for complete search history.

(56) References Cited

U.S. PATENT DOCUMENTS 10,978,629 B2    4/2021 Tehrani
10,991,868 B2    4/2021 Sugiura et al.
(Continued)

FOREIGN PATENT DOCUMENTS

EP    2631331 A1    8/2013
EP    2615193 B1    9/2015
(Continued)

OTHER PUBLICATIONS

Xu et al. "Lignin-based carbon fibers: Carbon nanotube decoration and superior thermal stability", Carbon 80, 2014, pp. 91-102. (Year: 2014).*
(Continued)

*Primary Examiner* — Daniel P Malley, Jr.
(74) *Attorney, Agent, or Firm* — Hoffman Warnick LLC (57) ABSTRACT

A thermoelectric material comprising carbon nanotubes and lignin. The carbon nanotubes are present as fibres and the lignin is present in pores and/or voids in the carbon nanotube fibres. The lignin may act as a dopant to increase the thermoelectric efficiency of the carbon nanotubes, multi-walled carbon nanotubes in particular. A method of forming a thermoelectric material involving impregnating fibres of carbon nanotubes with lignin, is also provided. A thermoelectric element, a fabric and a thermoelectric device comprising the thermoelectric material are also provided. The thermoelectric material may be particularly useful for the production of wearable thermoelectric devices.

10 Claims, 6 Drawing Sheets

(a)

(b)

(51) Int. Cl.
*H10N 10/01* (2023.01)
*H10N 10/857* (2023.01)

(56) References Cited

U.S. PATENT DOCUMENTS

| | | | | |
|---|---|---|---|---|
| 2009/0044848 A1* | 2/2009 | Lashmore | ............ | H10N 10/17 |
| | | | | 136/201 |
| 2011/0285049 A1* | 11/2011 | Baker | ............ | H01B 1/24 |
| | | | | 264/105 |
| 2013/0211056 A1* | 8/2013 | Berlin | ............ | C08L 97/005 |
| | | | | 530/500 |
| 2019/0006570 A1* | 1/2019 | Sugiura | ............ | H01L 51/0093 |
| 2019/0032250 A1* | 1/2019 | Ganster | ............ | D01F 9/16 |
| 2019/0271101 A1* | 9/2019 | Korzhenko | ............ | D01F 9/17 |

FOREIGN PATENT DOCUMENTS

| | | |
|---|---|---|
| EP | 2631330 B1 | 9/2015 |
| JP | 2018067608 A | 4/2018 |
| WO | 2017011551 A1 | 1/2017 |

OTHER PUBLICATIONS

Wang et al., "Reinforcement of lignin-based carbon fibers with functionalized carbon nanotubes", 2016, Composite Science and Technology 128, pp. 116-122. (Year: 2016).*

Subramanian et al., "Thermoelectric Properties of Biopolymer Composites", 2017, Biopolymer Composites in Electronics, pp. 155-183. (Year: 2017).*

Kleinhans et al., "Development of lignin carbon fibers: Evaluation of the carbonization process", Journal of Applied Polymer Science , All Pages, 2016. (Year: 2016).*

PCT International Search Report and Written Opinion for International Application No. PCT/EP2019/085102, dated Feb. 19, 2020, 12 pages.

Great Britain Search Report for Application No. GB1820651.6 dated Apr. 24, 2019, 3 pages.

Dalton et al., "Thermoelectric properties of electrospun carbon nanofibres derived from lignin," International Journal of Biological Macromolecules, Elsevier, vol. 121, Oct. 12, 2018, pp. 472-479.

Milczarek et al., "Carbon nanotubes/kraft lignin composite: Characterization and charge storage properties," Materials Research Bulletin, vol. 48, No. 10, Jun. 20, 2013, pp. 4032-4038.

Goodman et al., "Development of carbon nanotube—cellulose composites using a simple papermaking process for multifunctional sensing applications," Proceedings of SPIE, vol. 10165, Apr. 11, 2017, pp. 101650N-101650N.

Xu et al., "Lignin-based carbon fibers: Carbon nanotube decoration and superior thermal stability," Carbon, Elsevier, vol. 80, Aug. 23, 2014, pp. 91-102.

Vilatela et al., "Yam-Like Carbon Nanotube Fibers," Advanced Materials, vol. 22, No. 44, Nov. 24, 2010, pp. 4959-4963.

Wang et al., "Lignin-based carbon fibers: Formation, modification and potential applications," Green Energy & Environment 7: 578-605 (2022; available online Apr. 8, 2021).

* cited by examiner

THERMOELECTRIC MATERIALS

FIELD

The present invention relates to a thermoelectric material, a thermoelectric element, a fabric, a thermoelectric device and a method of producing said thermoelectric material. In particular the invention relates to thermoelectric materials comprising carbon nanotubes and lignin which are suitable for use in wearable thermoelectric devices.

BACKGROUND

Thermoelectric materials are capable of directly converting heat into electricity. When a temperature gradient is applied to opposing parts or sides of the thermoelectric material, an electric voltage is induced by diffusion of charge carriers from one part or side of the thermoelectric material to the other. This property offers the potential to convert waste heat into usable electricity. The thermoelectric properties of a material can be quantified and compared using their Seebeck coefficients (S) using the following equation:

$$S(\mu V/K) = \Delta V(\mu V)/\Delta T(K)$$

wherein $\Delta V$ is the difference in the electrical potential across the thermoelectric material and $\Delta T$ is the difference in temperature across the thermoelectric material.

The thermoelectric properties of a material can be quantified and compared using their figure of merit (ZT) or power factor (PF)

$$zT = \frac{\sigma S^2}{\kappa} T$$

where $\sigma$ is electrical conductivity (S/m), $\kappa$ is thermal conductivity (W/(m·K)), T is the temperature of the material in Kelvin, and S is the materials Seebeck coefficient (V/K).

Also a commonly quoted figure is a material's power factor, $PF = \sigma S^2$, the units of which are $\mu W/K^2 m$.

An example of a known thermoelectric material is $Bi_2Te_3$, which has been used to manufacture thermoelectric devices known as Peltier modules. These known devices have several drawbacks, for example the toxicity of the materials, high costs of production and difficulties in producing large scale devices.

The use of organic semiconductor materials such as conducting polymers or carbon-based nanocomposites may overcome some of these disadvantages. However, the thermoelectric efficiency achieved by some such materials is low which limits the usefulness of such materials, in part due to the large impedance of these materials.

WO 2016090363 A1 discloses a thermoelectric material comprising a polymer interface layer and first and second layers disposed on different sides of the polymer interface layer comprising a plurality of aligned, wavy carbon nanotubes (CNTs).

WO 2018012377 A1 discloses a thermoelectric conversion element which comprises a p-type thermoelectric conversion layer and an n-type thermoelectric conversion layer. The p-type thermoelectric conversion layer comprises a nano-carbon material and an onium salt or an inorganic salt.

SUMMARY OF THE INVENTION

It is one aim of the present invention, amongst others, to provide a thermoelectric material that addresses at least one disadvantage of the prior art, whether identified here or elsewhere, or to provide an alternative to existing thermoelectric materials. For instance it may be an aim of the present invention to provide a thermoelectric material which provides improved thermoelectric properties compared to known carbon nanomaterial-based materials.

According to aspects of the present invention, there is provided a thermoelectric material, a thermoelectric element, a fabric, a thermoelectric device and a method as set forth in the appended claims. Other features of the invention will be apparent from the dependent claims, and the description which follows.

According to a first aspect of the present invention, there is provided a thermoelectric material comprising carbon nanotubes and lignin.

The inventors have surprisingly found that the incorporation of lignin into carbon nanotubes may improve the thermoelectric properties of the carbon nanotubes. Suitably the carbon nanotubes are carbon nanotube fibres. The carbon nanotubes are suitably macroscopic fibres of carbon nanotubes.

Suitably the lignin is impregnated/incorporated into the carbon nanotubes. Therefore the lignin is incorporated into the carbon nanotubes (i.e. a network of carbon nanotubes) to form a nanocomposite material. The thermoelectric material of this first aspect may be additionally or alternatively defined as carbon nanotube fibres impregnated with lignin or a composite of lignin and carbon nanotube fibres.

Lignin, along with hemicellulose and cellulose, is one of the most abundant components of lignocellulosic biomass. Lignin is an amorphous material present in the cell walls of pith, roots, fruit, buds and bark and mainly comprises aromatic biopolymers. Lignin is produced as a very low value product form the pulp and paper industry.

Without being bound by theory, it is believed that the lignin acts as a dopant which may improve the thermoelectric properties of the carbon nanotubes and therefore form a composite material with electronic structure distinct from that of the constituent materials. The aromatic and phenolic functionality in the lignin structure may provide good compatibility of the lignin with the carbon nanotubes and enable the lignin to undergo the charge transfer interactions which provide such a dopant effect to the thermoelectric material.

The thermoelectric material of this first aspect may enable the production of relatively large scale thermoelectric devices due to the low cost of producing the thermoelectric material and the abundance of the raw materials, compared to the rare earth metals used in known thermoelectric devices, for example thermoelectric materials formed from $Bi_2Te_3$.

The thermoelectric material of this first aspect may also enable the production of devices with augmented or improved mechanical properties, such as flexibility (in bending), tensile strength, ductility, toughness and the ability to be woven/knitted.

The inventors have also found that the thermoelectric material of this first aspect may have mechanical properties which are suitable for the production of flexible and wearable thermoelectric devices.

The lignin used in the thermoelectric material of this first aspect may also provide the advantage of improving the environmental profile of thermoelectric materials due to the potentially more sustainable production of lignin compared to known dopants/thermoelectric material components.

In the context of the present invention, the term "carbon nanotube" refers to a structure conceptually similar to that made by rolling up a sheet of graphene into a cylinder. Depending on the rolling degree and the way the original graphene sheet is formed, carbon nanotubes of different diameter and internal geometry can be formed. Carbon nanotubes formed by rolling up of a single sheet forming the aforementioned cylinder, are called "single-walled" carbon nanotubes (SWCNTs). The carbon nanotubes formed by rolling up more than one sheet of graphene with a structure that resembles a series of concentric cylinders of increasing diameters from the center to the periphery are called "multi-walled" carbon nanotubes (MWCNTs).

Carbon nanotubes have high electrical conductivity and single-walled carbon nanotubes may generally have better thermoelectric properties than multi-walled carbon nanotubes. However, the high cost of SWCNTs is problematic for the production of thermoelectric devices on a large scale. In contrast MWCNTs are relatively inexpensive to produce compared to SWCNTs.

The carbon nanotubes of the thermoelectric material of this first aspect are suitably single-walled carbon nanotubes or multi-walled carbon nanotubes.

Suitably the carbon nanotubes of the thermoelectric material of this first aspect are multi-walled carbon nanotubes. The inventors have found that the use of lignin with carbon nanotubes in a thermoelectric material may be particularly advantageous when the carbon nanotubes are multi-walled carbon nanotubes as the lignin may improve the generally less favourable thermoelectric properties of the multi-walled carbon nanotubes compared with single-walled carbon nanotubes.

In embodiments wherein the carbon nanotubes are multi-walled carbon nanotubes, the multi-walled carbon nanotubes suitably comprise from 2 to 5 graphitic layers.

The carbon nanotubes suitably have a high aspect ratio (length-to-diameter ratio), suitably an aspect ratio of between 10 and 10,000,000 to 1, suitably between 100 and 10,000,000 to 1. The carbon nanotubes are also suitably highly graphitic.

The thermoelectric material of this first aspect suitably comprises or consists of carbon nanotube-based fibres. In the context of the present invention, the term "carbon nanotube-based fibres" refers to a macroscopic array of agglomerated carbon nanotubes as defined above, where the fibre can be used as an individual filament, in a flat film or sheet, or as a woven or non-woven fabric. By grouping carbon nanotubes as fibres, their mechanical properties as well as their electrical conductivity can be enhanced. In addition, the carbon nanotube-based fibers used in the present invention comprise pores or voids which are formed between the carbon nanotubes due to imperfect packing.

Suitably the carbon nanotube-based fibres used in the present invention are fibres having a specific surface area between 50 and 2000 $cm^2/g$. Suitably the carbon nanotubes are in the form of fibres having a specific surface area between 50 and 2000 $cm^2/g$, suitably approximately 250 $cm^2/g$.

Suitably the carbon nanotube-based fibres used in the present invention are fibres having a diameter between 0.1 and 1000 microns. Suitably the carbon nanotubes are in the form of fibres having a diameter of 10 microns.

It is believed that any type of lignin can be utilised in the thermoelectric material of this first aspect, for example lignin obtained from softwood, hardwood or grass/annual plants. Suitable lignin can be obtained from these sources using various known processes, for example the Kraft, organosolve or soda processes. In some embodiments, more than one type and/or source of lignin is used to provide the lignin of the thermoelectric material.

In some embodiments the lignin is an organosolve lignin.

Suitably the thermoelectric material comprises at least 5 wt % lignin, suitably at least 10 wt %, suitably at least 20 wt %.

Suitably the thermoelectric material comprises up to 65 wt % lignin, suitably up to 60 wt %, suitably up to 55 wt %.

Suitably the thermoelectric material comprises from 5 to 65 wt % lignin, suitably from 10 to 60 wt % lignin, suitably from 20 to 50 wt % lignin.

Suitably the thermoelectric material comprises up to 10 wt % lignin, suitably up to 8 wt % lignin, suitably up to 6 wt % lignin.

The thermoelectric material of this first aspect suitably comprises or consists of fibres of the carbon nanotubes impregnated and/or infiltrated with the lignin.

Suitably the fibres of carbon nanotubes comprise pores and/or voids into which the lignin is incorporated, to provide fibres of carbon nanotubes impregnated and/or infiltrated with lignin.

Suitably the lignin is present within pores of the carbon nanotube fibres, suitably between bundles of carbon nanotubes, wherein each bundle comprises around 2-10 carbon nanotubes. Suitably the lignin and the carbon nanotubes are intimately mixed to coat the internal pores of the carbon nanotube fibres of the thermoelectric material, rather the lignin forming an outer layer around the carbon nanotube fibres, for example. The carbon nanotube fibres may be referred to as "impregnated" and/or "infiltrated" with lignin.

The thermoelectric material of this first aspect is suitably a yarn comprising a plurality of carbon nanotube fibres. The carbon nanotube fibres in the yarn consist of an array of parallel carbon nanotube fibres bundled together, typically comprising from 10 to 100 carbon nanotube fibres. Such yarns of carbon nanotube fibres can be produced, for example, by winding multiple carbon nanotube fibres onto the same spool and then physically bundling them together by manually rolling them off the spool sideways.

In some embodiments, the thermoelectric material of this first aspect is a yarn comprising at least 10 fibres of carbon nanotubes, suitably at least 100 fibres of the carbon nanotubes impregnated and/or infiltrated with the lignin.

According to a second aspect of the present invention, there is provided a thermoelectric element comprising a thermoelectric material according to the first aspect.

The thermoelectric element may consist of a yarn of thermoelectric material as described in relation to the first aspect. The thermoelectric element may be a fabric comprising yarns or fibres as described in relation to the first aspect.

The thermoelectric element of this second aspect may be incorporated into a thermoelectric device, suitably a wearable thermoelectric device.

According to a third aspect of the present invention, there is provided a fabric comprising a thermoelectric material according to the first aspect. Suitably the fabric comprises a planar array of carbon nanotube fibres. Such an array may be alternatively or additionally referred to as a "mat", as described in EP2631330B1. The terms "fabric" or "mat" in the context of the present invention may be used generally to refer to structures which are smaller in one dimension than in the other two dimensions. Fabrics or mats may be flat or curved in shape. The fabric can be produced, for example, by winding multiple carbon nanotube fibres onto a spool and then physically consolidating the fabric by applying a mechanical force perpendicular to the plane of the fibres, that is, by pressing them down.

Suitably the fabric has a thickness of at least 0.01 µm, suitably at least 0.1 µm, suitably at least 1 µm.

Suitably the fabric has a thickness of up to 1,000 µm, suitably up to 100 µm, suitably up to 10 µm.

The fabric suitably has a thickness from 0.01 to 1,000 µm, suitably from 0.1 to 100 µm, suitably from 1 to 10 µm.

The fabric may be a woven or non-woven sheet, suitably comprising fibres of the carbon nanotubes impregnated and/or infiltrated with the lignin.

In some embodiments, the fabric is a unidirectional non-woven sheet of fibres of the carbon nanotubes impregnated and/or infiltrated with the lignin, suitably having a thickness between 1 and 10 µm.

The fabric may be suitable for forming or incorporating into a wearable thermoelectric device.

According to a fourth aspect of the present invention, there is provided a thermoelectric device comprising a thermoelectric material according to the first aspect, a thermoelectric element according to the second aspect or a fabric according to the third aspect.

Suitably the thermoelectric device is adapted to be arranged in use on a user's body and to generate electricity from heat from said body of said user.

Suitably the thermoelectric device comprises an electrical circuit, suitably connected to opposite sides of the thermoelectric material. Suitably the thermoelectric device comprises a functional module which is connected to the electrical circuit in order to power the functional module. The functional module may be a sensor, a screen or a communications device. Suitably the thermoelectric device is a relatively low cost, scalable and flexible device. Suitably the thermoelectric device has augmented or improved mechanical properties, such as flexibility (in bending), tensile strength, ductility, toughness and the ability to be woven/knitted, compared to known thermoelectric devices.

According to a fifth aspect of the present invention, there is provided a method of forming a thermoelectric material comprising carbon nanotubes and lignin, the method comprising the steps of:
  a) providing fibres of carbon nanotubes;
  b) impregnating the fibres of carbon nanotubes with lignin.

Suitably the thermoelectric material formed in the method of this fifth aspect is a thermoelectric material according to the first aspect, a thermoelectric element according to the second aspect or a fabric according to the third aspect.

In some embodiments, step a) is carried out before step b).

In some embodiments, step a) involves producing the fibres of carbon nanotubes by chemical vapour deposition.

In some embodiments step a) involves producing the fibres of carbon nanotubes by direct spinning from a gas phase. For example, the fibres of carbon nanotubes may be synthesized by a direct spinning method which involves the continuous withdrawal of a carbon nanotube aerogel directly from a gas-phase during growth of the carbon nanotubes by floating catalyst chemical vapor deposition. Such a procedure is disclosed in EP 2615193 B1, EP 2631330 B1 and EP 2631331 A1, for example using ferrocene as iron catalyst, thiophene as a sulfur catalyst promoter and butanol as carbon source. Such a reaction may be carried out in hydrogen atmosphere at 1,250° C., using a S/C ratio to produce fibres predominantly made up of muti-walled carbon nanotubes. A carbon nanotube fabric may be prepared by winding multiple fibres of carbon nanotubes onto a rotating bobbin under transverse motion. The resulting porous fabric may be consolidated by densification, for example with acetone, and dried at room temperature.

In some embodiments, step b) involves treating the fibres of carbon nanotubes with a solution comprising the lignin and a solvent. Suitably the solvent is an organic solvent, for example tetrahydrofuran (THF). Suitably the solvent is a polar aprotic organic solvent. The solvent may be selected from dimethylformamide (DMF), dimethylsufoxide (DMSO), acetone and THF.

Step b) may be carried out as a separate step in a batch-wise process. Alternatively, step b) may be carried out in-line immediately after step a) has been carried out as the fibres of carbon nanotubes are produced.

Step b) may be carried out by a plurality of fibre impregnation methods, such as bath immersion, spraying and wet-rolling, amongst others.

The inventors have found that the method of this fifth aspect can be used to incorporate lignin from different sources into the carbon nanotubes. This treatment of the carbon nanotube fibres favours infiltration and interaction of the lignin with the carbon nanotube fibres leading to enhanced thermoelectric properties of the composite material produced.

EXAMPLES

Sample Preparation—Fabric

In a non-limiting example, a non-woven unidirectional fabric was produced by winding fibres of carbon nanotubes onto a bobbin and densifying the material with a solvent. In an example particularly relevant for industrialisation, such a fabric was produced from carbon nanotube fibres that were directly collected from the gas-phase during their synthesis by chemical vapour deposition, as described in EP2615193B1, EP2631330B1 and EP2631331A1. Briefly, this method of preparing the carbon nanotube fibres involves the production of a carbon nanotube agglomerate, comprising the steps of: passing a flow of one or more gaseous reactants into a reactor; reacting the one or more gaseous reactants within a reaction zone of the reactor to form an aerogel; agglomerating the aerogel into an agglomerate; and applying a force to the agglomerate to displace it continuously away from the reaction zone.

The porous nature of fibres of carbon nanotubes formed from said methods (and therefore fabrics formed from said fibers) allows the infiltration of lignin into the fabric. Infiltration with lignin can be carried out in-line as the fibre is produced and wound as a fabric, or in a subsequent step.

To impregnate the carbon nanotube fibre fabric with lignin, the carbon nanotube fibre fabrics were immersed in a 5 wt % solution of lignin (organosolv hardwood provided by Thecnaro, Germany) in THF for 5 minutes. The carbon nanotube fibre fabric was then dried at 70° C. for 1 hour.

Sample Preparation—Yarns

In order to form the yarns described herein, a plurality of carbon nanotube fibres prepared as described above were collected on a spool and rolled off the spool sideways to provide a "yarn".

Carbon nanotube fibre yarns were impregnated with lignin using the same methods as described above. Table 1 below shows the different concentrations of lignin/THF solutions which were used and the wt % of lignin in the CNT/lignin yarns produced, measured by calculating the difference between the weight of the samples before and after impregnation with lignin and drying.

TABLE 1

Yarns

| Yarn sample no. | Lignin concentration in THF Solution wt. % | Amount of lignin in yarns wt. % |
|---|---|---|
| 1 | 1.00% | 13% |
| 2 | 2.50% | 23% |
| 3 | 5.00% | 34% |
| 4 | 10.00% | 53% |
| 5 | 20.00% | 56% |

SEM Images

Figure 1:
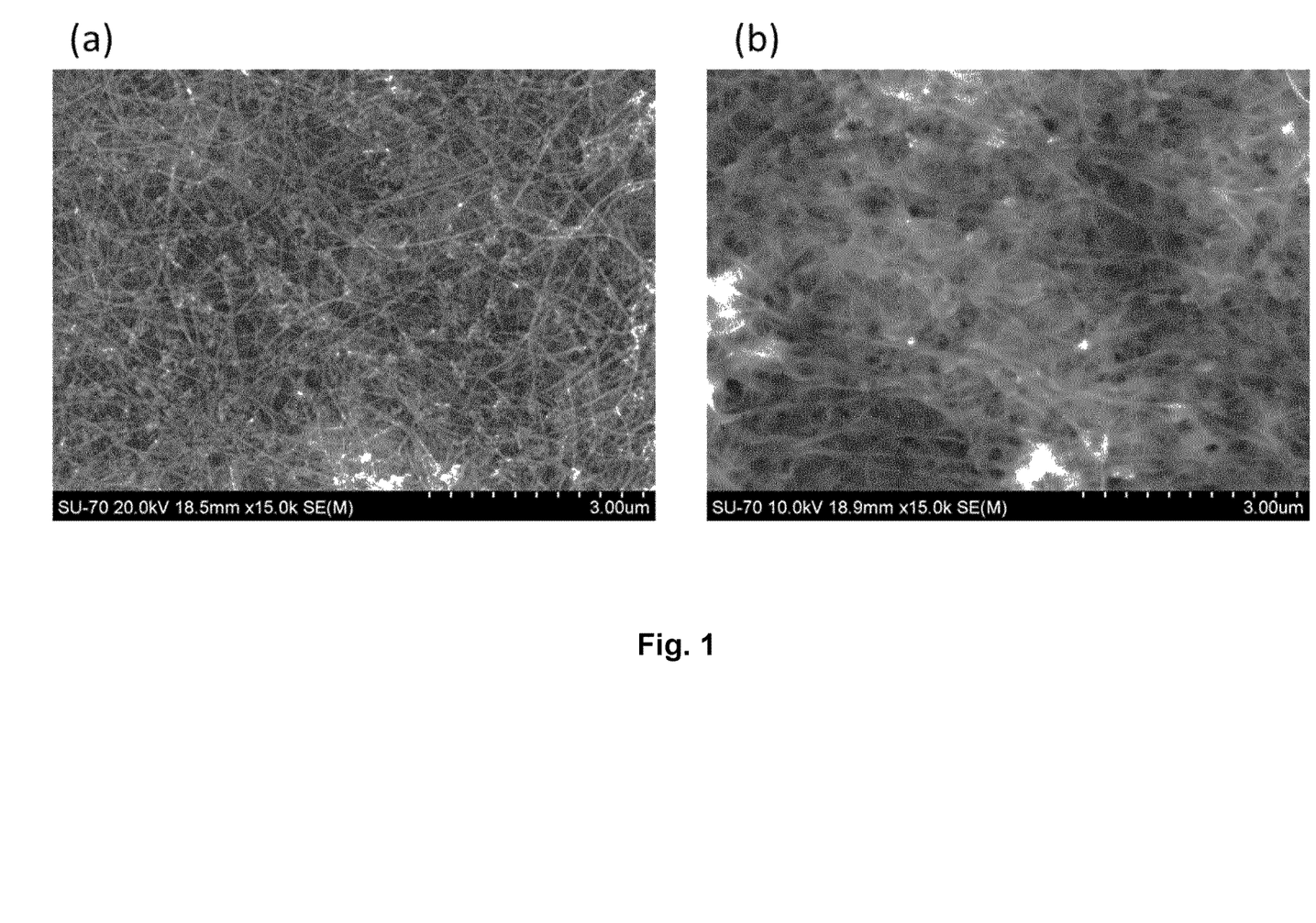
FIG. 1 shows scanning electron microscope (SEM) images of the fabric (a) before and (b) after lignin infusion.

FIG. 1 shows scanning electron microscope (SEM) images of the fabric (a) before and (b) after lignin infusion. These SEM images show the morphology of the fabric before and after lignin infusion. A comparison of the SEM images indicates how lignin has filled the gaps/voids between the carbon nanotube fibres in the fabric.

Electrical Conductivity Measurements on Fabrics and Yarns

The electrical conductivity of the fabric prepared as described above was obtained using the van der Pauw method. This method can be utilized to determine the conductivity of thin films wherein the distance between contacts is much larger than the sample thickness. Four contacts to the fabric were used in this method to eliminate the effect of the contact resistance. The van der Pauw equation used in this method is given below:

$$e^{-\pi \cdot d \cdot R_1 \sigma} + e^{-\pi \cdot d \cdot R_2 \sigma} = 1$$

wherein $\sigma$ is the conductivity, d is the sample thickness, and $R_1$ and $R_2$ are the resistance values. To calculate $R_1$ and $R_2$, the following equations were used:

$$R_1 = V_{BD}/I_{AC} \text{ and } R_2 = V_{AB}/I_{CD}$$

wherein V and I are the voltage and intensity across the sample respectively, and A, B, C and D are the four contacts with the fabric.

Figure 5:
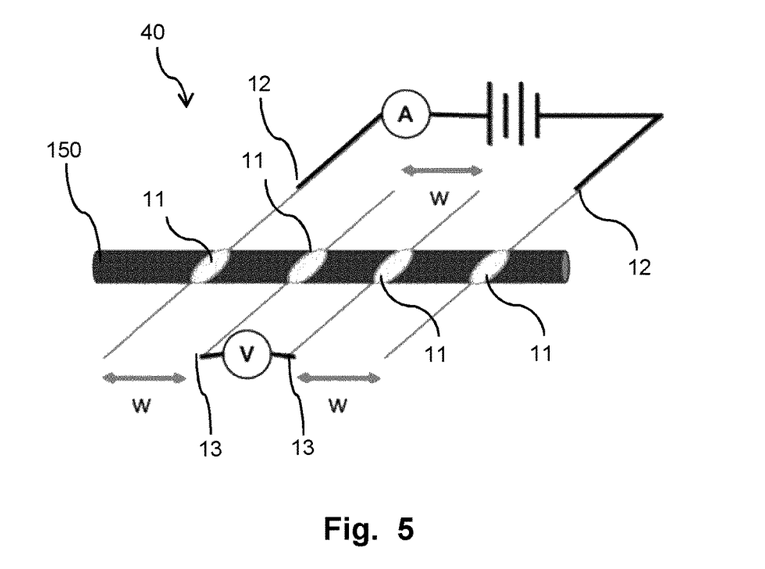
FIG. 5 shows a schematic of the test set-up (40) used to determine the electrical conductivity of the yarn samples (150).

The electrical conductivity of the yarns prepared as described above (prior to formation into fabric) was determined by using a four point probe method as is shown in FIG. 5. Using this method, the resistance was obtained and the conductivity was calculated using the following equation:

$$\sigma = \frac{\ln 2}{\pi w R}$$

where $\sigma$ is the conductivity of the yarn, w is the yarn diameter, and R is the resistance measured in the yarn.

The Seebeck coefficient (S) is determined as the ratio between the electrical potential, $\Delta V$, and the temperature difference, $\Delta T$:

$$S = \frac{\Delta V}{\Delta T}$$

In order to create a temperature difference, the sample was placed between two Peltier modules powered by a power supply. The temperature was measured by k-type thermocouples while the voltage was recorded using a Keithley 2000 multimeter.

Table 2 shows the thermoelectric properties of the fabric before ("Comp." denotes comparative sample) and after lignin infusion (samples 2 to 5). Table 3 shows the same data for yarn samples 1-5 and the lignin-free "comparative" sample. The thermoelectric efficacy can be quantified by the Power factor (PF=$\sigma \cdot S^2$). These values are useful for comparing samples with similar thermal conductivity. The results in Table 1 indicate that after lignin infusion the power factor increases significantly, mainly due to the increase in the Seebeck coefficient.

TABLE 2

Thermoelectric parameters of the fabric samples.

| Fabric sample no. | Lignin conc. in THF | R1 ($\Omega$) | R2 ($\Omega$) | Conductivity using R1 (S/cm) | Conductivity using R1 and R$_2$ (S/cm) | Seebeck ($\mu$V/K) | Power Factor ($\mu$V/mK$^2$) using R$_1$ | Power Factor ($\mu$V/mK$^2$) using R$_1$ and R$_2$ |
|---|---|---|---|---|---|---|---|---|
| Comp. | 0.0% | 0.60 | 7.00 | 241.00 | 55.745 | 48.343 | 56.3228 | 13.03 |
| 2 | 2.5% | 0.50 | 1.80 | 350.00 | 173.967 | 96.339 | 324.8421 | 161.46 |
| 3 | 5.0% | 1.10 | 2.10 | 286.00 | 199.505 | 94.396 | 254.8433 | 177.77 |
| 4 | 10.0% | 0.50 | 3.45 | 490.00 | 155.844 | 69.964 | 239.8531 | 76.29 |
| 5 | 20.0% | 0.14 | 6.50 | 358.00 | 30.812 | 76.49 | 209.4558 | 18.03 |

TABLE 3

Thermoelectric properties of yarn samples.

| Yarn sample no. | Lignin concentration in THF Solution wt. % | Resistance Ω | Conductivity S/cm | Seebeck µV/K | Power Factor µW/K²m |
|---|---|---|---|---|---|
| Comparative | 0% | 1.10 | 60.173 | 56.901 | 19.48 |
| 1 | 1.0% | 0.84 | 157.595 | 83.64 | 110.25 |
| 2 | 2.5% | 0.70 | 135.082 | 98.933 | 132.21 |
| 3 | 5.0% | 0.50 | 120.346 | 94.621 | 107.75 |
| 4 | 10.0% | 0.59 | 59.046 | 77.742 | 35.69 |
| 5 | 20.0% | 0.61 | 31.002 | 72.428 | 16.26 |

Figure 2:
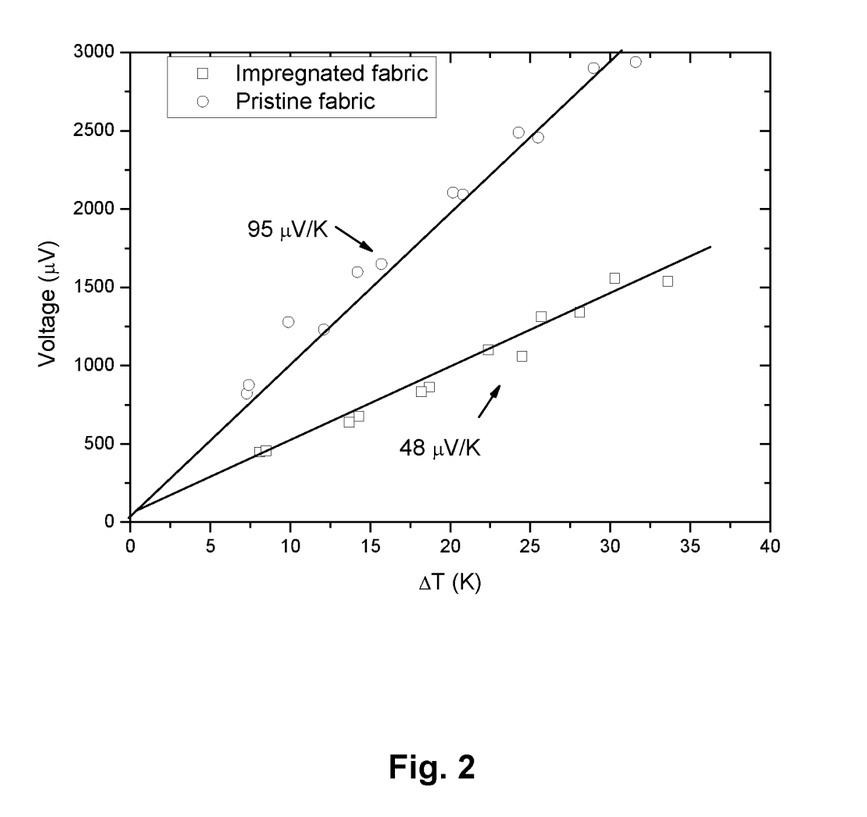
FIGS. 2 and 3 are graphs of voltage generated as a function of the temperature difference of the "pristine" and "impregnated" fabrics and yarns respectively.
Figure 3:
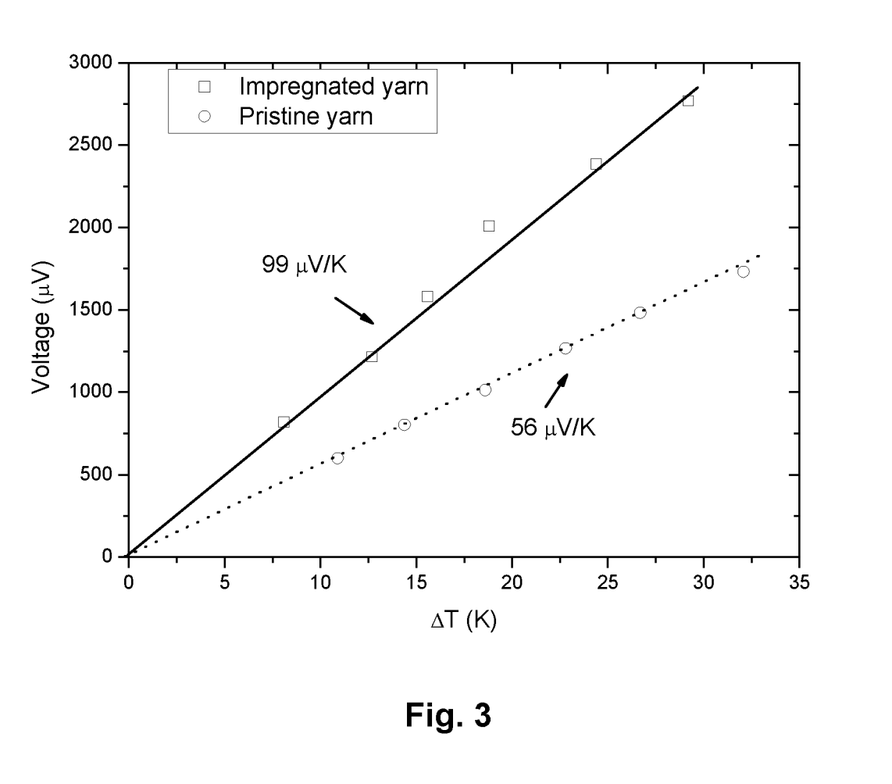

FIGS. 2 and 3 show voltage generated as a function of the temperature difference of the "pristine" and "impregnated" fabrics and yarns respectively. With the addition of lignin, both of the parameters electrical conductivity and Seebeck coefficient increase. Therefore the thermoelectric efficiency given by the PF is higher compared to the comparative sample which comprises carbon nanotubes with no lignin impregnation. These results show a significant increase of approximately an order of magnitude in the PF with the lignin impregnated samples 2-5. This means that thermoelectric materials and thermoelectric devices comprising such lignin impregnated carbon nanotube fibres may generate electricity more efficiently that known thermoelectric materials and devices, particularly compared to known multi-walled carbon nanotube thermoelectric materials and devices.

Figure 4:
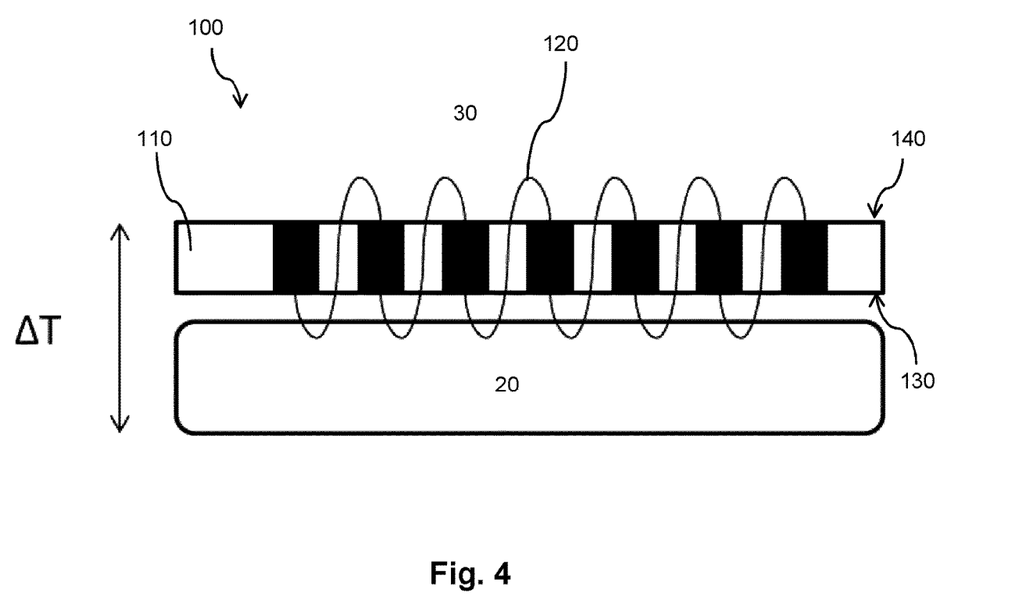
FIG. 4 shows a schematic representation of a thermoelectric device (100) according to the fourth aspect of the present invention.

FIG. 4 shows a schematic representation of a thermoelectric device (100) according to the fourth aspect of the present invention. The thermoelectric device (100) comprises a fabric (110) according to the third aspect of the present invention and a nickel wire (120) wound through the fabric (110). The fabric (110) comprises carbon nanotube fibres and lignin, and was prepared as described above. The thermoelectric device (100) is a wearable thermoelectric device for body heat recovery. The temperature difference between the user's skin (20) and ambient air (30) (outside of the user's skin (20) and the thermoelectric device (100)) produces a temperature difference between the skin side (130) and the air side (140) of the thermoelectric device (100). This temperature difference causes a voltage to be established across the fabric (110) which drives an electrical current through the nickel wire (120). The current can then be used to power a functionality of the device, for example a health sensor or monitor, or a communications device. Therefore the thermoelectric device (100) can generate useful electricity from the user's body heat which would otherwise be lost to the atmosphere. The thermoelectric device (100) may be able to do this more effectively than if the lignin was not present in the fabric.

FIG. 5 shows the test set-up (40) used to determine the electrical conductivity of the yarn samples (150). Four electrical contacts (11) are made in the sample yarn (150) with silver paint. The electric current (A) is applied between end contacts (12) and the voltage (V) is measured between the internal contacts (13).

Figure 6:
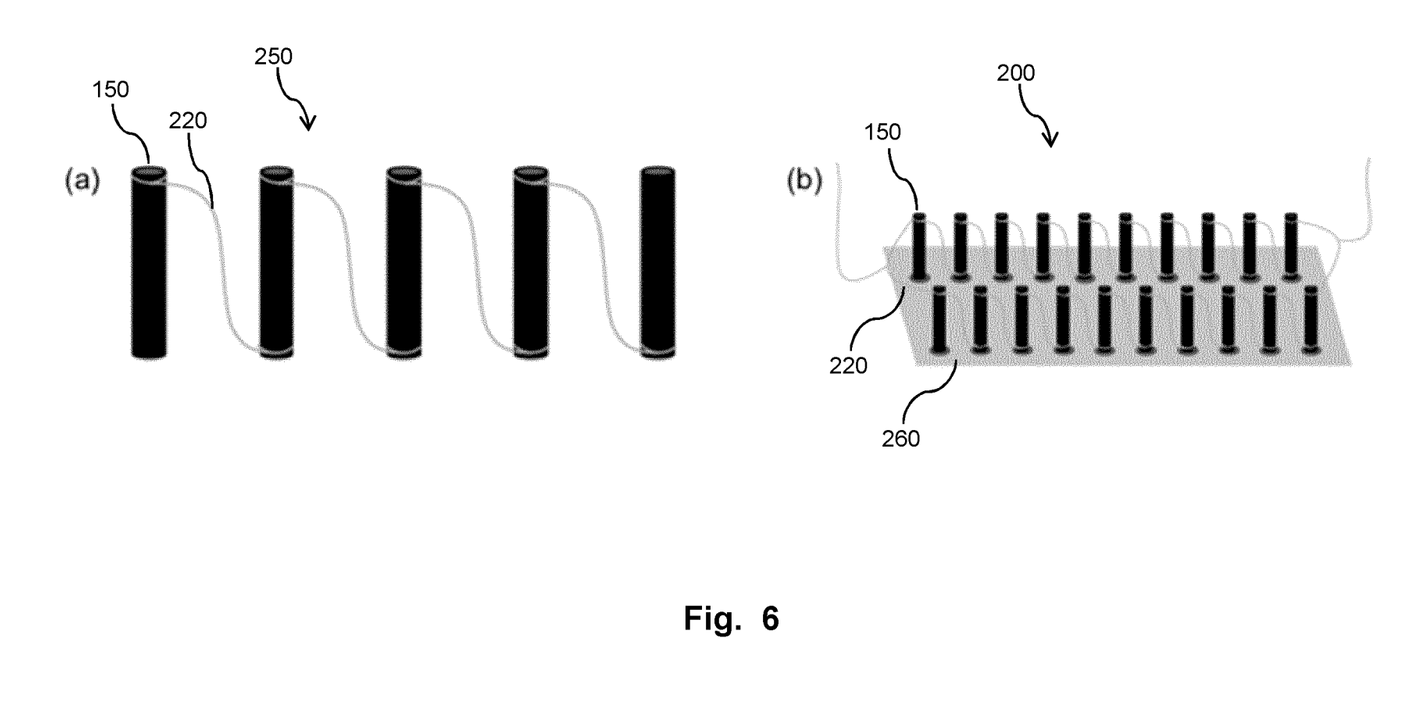
FIG. 6 shows a schematic of a thermoelectric device (200) comprising twenty pieces of carbon nanotube fibre yarn impregnated with lignin (150).
Figure 7:
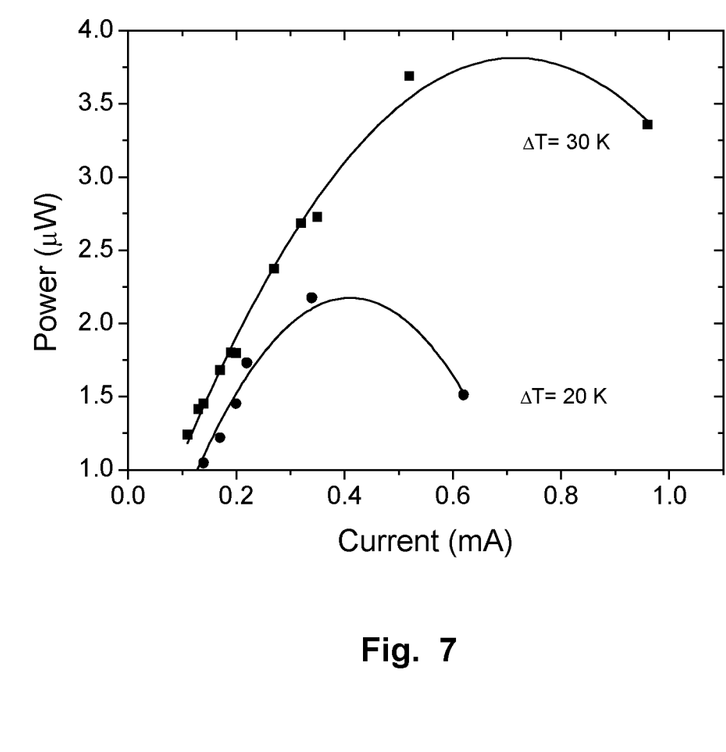
FIG. 7 is a graph of power output as a function of the electrical current generated at temperature gradients of 30 °K and 20 °K, of the thermoelectric device (200) in use.

FIG. 6 shows a schematic of a thermoelectric device (200) comprising twenty pieces of carbon nanotube fibre yarn impregnated with lignin (150). The device was prepared by first preparing twenty 5 mm long yarns impregnated with lignin (from a 2.5 wt % lignin solution in THF), which may be considered "thermoelectric elements", and grouping these into four sets of five carbon nanotube fibre yarns (250). Each of these sets were bound together with cooper wire (220), with the top of one yarn being tied to the bottom of the next. A schematic of such a group of carbon nanotube fibre yarns is shown in FIG. 6(a). The copper wire was secured to the yarns with silver paint to ensure good contact. Once these four sets were made, they were arranged so that there would be two groups of ten yarns in series with each other, and these two groups would be parallel to each other, as shown in FIG. 6(b). These were then secured to a copper plate (260) coated in a thermally non-conductive coating using a non-conducting silicon glue. When worn by a user, a temperature difference is created between the top and the bottom part of the device (you can create this temperature gradient heating the bottom part using a heat source for example the human body). FIG. 7 demonstrates the power output of the thermoelectric device (200) in use, showing the evolution of power as a function of the electrical current generated at temperature gradients of 30° K and 20° K. The device (200) showed a maximum power value of around 3.5 µW. This is a surprisingly high power output for such a thermoelectric device having twenty thermoelectric elements. Known devices having a similar number of thermoelectric elements have been reported to produce power outputs in the nW range, therefore orders of magnitude lower than the power output which may be provided by the thermoelectric device of the present invention.

In summary, the present invention provides a thermoelectric material comprising carbon nanotubes and lignin. The carbon nanotubes are present as fibres and the lignin is present in pores and/or voids in the carbon nanotube fibres. The lignin may act as a dopant to increase the thermoelectric efficiency of the carbon nanotubes, multi-walled carbon nanotubes in particular. A method of forming a thermoelectric material involving impregnating fibres of carbon nanotubes with lignin, is also provided. A thermoelectric element, a fabric and a thermoelectric device comprising the thermoelectric material are also provided. The thermoelectric material may be particularly useful for the production of wearable thermoelectric devices.

Although a few preferred embodiments have been shown and described, it will be appreciated by those skilled in the art that various changes and modifications might be made without departing from the scope of the invention, as defined in the appended claims.

Throughout this specification, the term "comprising" or "comprises" means including the component(s) specified but not to the exclusion of the presence of other components. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, when referring to compositions, a composition consisting essentially of a set of components will comprise less than 5% by weight, typically less than 3% by weight, more typically less than 1% by weight of non-specified components.

The term "consisting of" or "consists of" means including the components specified but excluding addition of other components.

Whenever appropriate, depending upon the context, the use of the term "comprises" or "comprising" may also be taken to encompass or include the meaning "consists essentially of" or "consisting essentially of", and may also be taken to include the meaning "consists of" or "consisting of".

For the avoidance of doubt, wherein amounts of components in a composition are described in wt %, this means the weight percentage of the specified component in relation to the whole composition referred to. For example, "suitably the thermoelectric material comprises at least 2 wt % lignin" means that 2 wt % of the thermoelectric material is provided by lignin.

The optional features set out herein may be used either individually or in combination with each other where appropriate and particularly in the combinations as set out in the accompanying claims. The optional features for each aspect or exemplary embodiment of the invention as set out herein are also to be read as applicable to any other aspect or exemplary embodiments of the invention, where appropriate. In other words, the skilled person reading this specification should consider the optional features for each exemplary embodiment of the invention as interchangeable and combinable between different exemplary embodiments.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, and drawings), and/or all of the steps of any method or process so disclosed, may be combined in any combination, except combinations where at least some of such features and/or steps are mutually exclusive.

Each feature disclosed in this specification (including any accompanying claims, and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, and drawings), or to any novel one, or any novel combination, of the steps of any method or process so disclosed.

The invention claimed is:

1. A thermoelectric material comprising carbon nanotube fibres impregnated with lignin, wherein the thermoelectric material is a yarn comprising the fibres of the carbon nanotubes impregnated with lignin, wherein the thermoelectric material comprises from 5 to 65 wt % of the lignin.

2. The thermoelectric material according to claim 1, wherein the carbon nanotubes are multi-walled carbon nanotubes.

3. The thermoelectric material according to claim 1, wherein the lignin is an organosolve lignin.

4. The thermoelectric material according to claim 1, comprising at least 10 wt % lignin.

5. A thermoelectric element comprising a thermoelectric material according to claim 1.

6. A fabric comprising a thermoelectric material according to claim 1.

7. A thermoelectric device comprising a thermoelectric material according to claim 1.

8. The thermoelectric device according to claim 7, wherein the thermoelectric device is adapted to be arranged in use on a user's body and to generate electricity from heat from said body of said user.

9. A thermoelectric device comprising a thermoelectric element according to claim 5.

10. A thermoelectric device comprising a fabric according to claim 6.

* * * * *